United States Patent [19]
Mochizuki

[11] Patent Number: 5,926,028
[45] Date of Patent: Jul. 20, 1999

[54] PROBE CARD HAVING SEPARATED UPPER AND LOWER PROBE NEEDLE GROUPS

[75] Inventor: Jun Mochizuki, Yamanashi-ken, Japan

[73] Assignee: Tokyo Electron Limited, Tokyo, Japan

[21] Appl. No.: 08/855,952

[22] Filed: May 14, 1997

[30] Foreign Application Priority Data

May 17, 1996 [JP] Japan .................................. 8-148098

[51] Int. Cl.$^6$ .......................... G01R 1/073; G01R 31/26
[52] U.S. Cl. .......................... 324/762; 324/754; 324/761
[58] Field of Search .................................. 324/754, 761, 324/762, 765, 72.5

[56] References Cited

U.S. PATENT DOCUMENTS

| | | | |
|---|---|---|---|
| 4,523,144 | 6/1985 | Okubo et al. | 324/762 |
| 4,567,433 | 1/1986 | Ohkubo et al. | 324/762 |
| 4,623,839 | 11/1986 | Garretson et al. | 324/762 |
| 5,055,778 | 10/1991 | Okubo et al. | 324/754 |

FOREIGN PATENT DOCUMENTS 4-186855   7/1992   Japan .
5-48133    12/1993  Japan .
7-318587   12/1995  Japan .

*Primary Examiner*—Glenn W. Brown
*Attorney, Agent, or Firm*—Oblon, Spivak, McClelland, Maier & Neustadt, P.C.

[57] ABSTRACT

A probe card comprises a base having a frame portion to define an opening portion therein and having a lower surface, and first and second resin fixing portions mounted on the lower surface of the frame portion and remote from each other to define a channel therebetween. The first resin fixing portion supports upper- and lower-level probe needle groups such that their intermediate portions are electrically insulated from each other, that distal end portions of the upper-level probe group are exposed to the opening portion of the base, and that distal end portions of the lower-level probe needle group are exposed to the channel. The second resin fixing portion supports intermediate portions of the upper-level probe needle group to be electrically insulated from each other. Needle point groups of the respective probe needle groups are brought into contact with electrodes of a plurality of rows×a plurality of columns of semiconductor elements on an inspection target body simultaneously, thereby performing inspection of electrical characteristics of the plurality of semiconductor elements simultaneously.

13 Claims, 3 Drawing Sheets

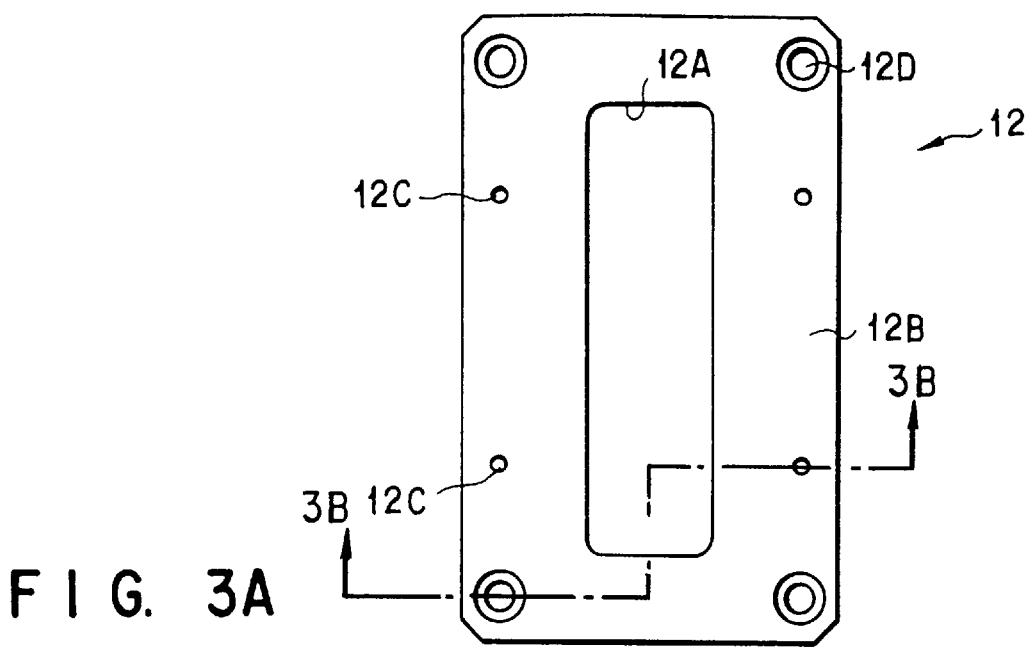
FIG. 3A
FIG. 3B
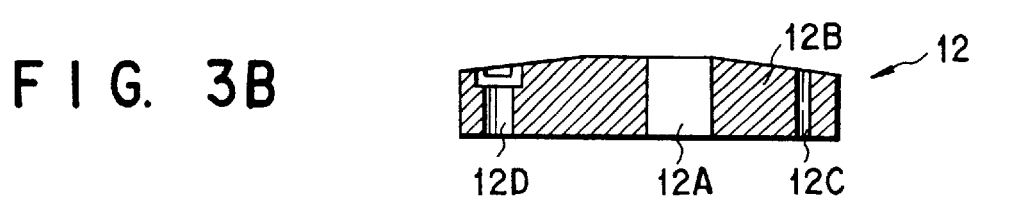
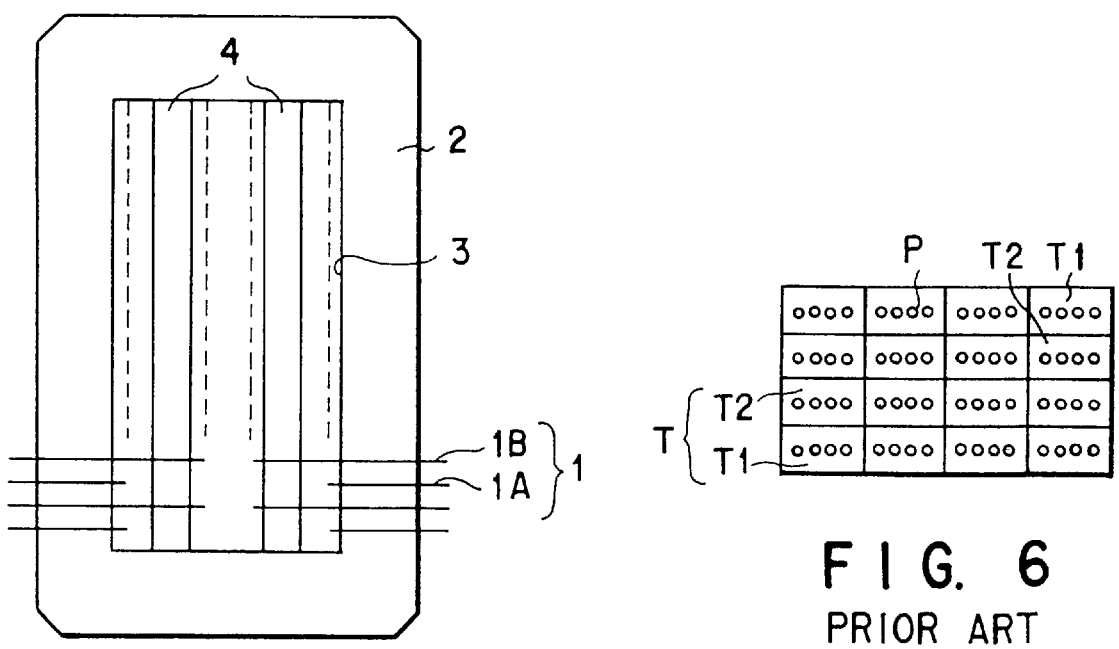
FIG. 5 PRIOR ART
FIG. 6 PRIOR ART

PROBE CARD HAVING SEPARATED UPPER AND LOWER PROBE NEEDLE GROUPS

BACKGROUND OF THE INVENTION

The present invention relates to a probe card for electrically inspecting a plurality of detection target elements, e.g., semiconductor elements on an inspection target body such as a semiconductor wafer, simultaneously.

Conventionally, when a large number of IC chips are formed on a semiconductor wafer in a semiconductor manufacturing process, whether the individual chips have initial electrical characteristics is inspected in an inspection process by using, e.g., a probe unit. If a defective component is found, this component is marked and is removed in a later process. This probe unit generally has a cassette support portion for supporting semiconductor wafers in units of cassettes, a convey mechanism for conveying semiconductor wafers one by one from the cassette support portion, a stage movable in the X, Y, Z, and θ directions to receive and send semiconductor wafers conveyed through this convey mechanism, and a probe card arranged above the stage. The electrical characteristics of the IC chips are inspected by bringing the probe needles of the probe card and the electrode pads of the IC chips on the semiconductor wafer into electrical contact with each other.

The probe card described above includes various types. Among them, a probe card in which probe needles are cantilevered is widely used. In a conventional probe card of this type, generally, the probe needles of the probe card are brought into electrical contact with the electrode pads of one IC chip to inspect the IC chips one by one. Recently, as the diameters of the semiconductor wafers increase, an improvement in inspection throughput is sought for. For this purpose, a probe card is developed in which upper- and lower-level probe needle groups are cantilevered by a base and different IC chips are respectively inspected simultaneously by the upper- and lower-level probe needle groups, as disclosed in, e.g., Jpn. Pat. Appln. KOKAI Publication No. 4-186855 and Jpn. UM Appln. KOKOKU Publication No. 5-48133. As an example of such a probe card, one having an arrangement as shown in FIG. 5 is known. FIG. 5 is a plan view showing the probe card from the needle side, i.e., from the lower side.

The probe card shown in FIG. 5 has upper- and lower-level first and second probe needle groups 1A and 1B and a rectangular base 2 for cantilevering these probe needle groups 1A and 1B. The needle point groups of the first and second probe needle groups 1A and 1B and all electrode pads P (see FIG. 6) of 16 (=4 rows×4 columns) IC chips T1 and T2 (represented by T) on a semiconductor wafer are brought into contact with each other to perform inspection of the electrical characteristics of the 16 IC chips T1 and T2 simultaneously. The base 2 is formed as a rectangular support frame having a rectangular opening portion 3 at its center. The first and second probe needle groups 1A and 1B, extending obliquely downward from the two side surfaces in the longitudinal direction of the base 2 toward the opening portion 3, are supported by the lower surface of the base 2. The first probe needle group 1A is formed short to come in contact with the outer IC chips T1, and the second probe needle group 1B is formed long to come in contact with the inner IC chips T2. The proximal portions of the first probe needle group 1A are directly fixed to the lower surface of the base 2 with, e.g., a synthetic resin, so that the first probe needle group 1A is cantilevered. The proximal portions of the second probe needle group 1B are fixed to right and left fixing plates 4, extending over the opening portion 3 in the longitudinal direction, with, e.g., a synthetic resin, so that the second probe needle group 1B is cantilevered.

In the probe card of this type, the second probe needle group 1B is cantilevered by the fixing plates 4 extending over the opening portion 3 of the base 2. Since the fixing plates 4 are thin and formed elongated, they do not have a sufficiently large mechanical strength. Then, variations occur in the needle pressure during inspection, and stable inspection cannot be performed accordingly. Since the fixing plates 4 tend to flex, when mounting the second probe needle group 1B on the fixing plates 4, the fixing plates 4 flex to degrade the precision of the needle positions. Also, since variations occur in the height of the needle points, it is technically difficult to align the needle points. Therefore, to mount the second probe needle group 1B on the fixing plates 4 requires a skill.

BRIEF SUMMARY OF THE INVENTION

It is an object of the present invention to provide a probe card in which a predetermined needle pressure can be reliably obtained with all the probe needles so that stable inspection can be performed, the probe needles can be mounted on the base with high precision, and a skill is not required when mounting the probe needles on the base.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

FIGS. 3A and 3B are views showing the base of the probe card shown in FIG. 1, in which FIG. 3A is a plan view showing the support surface side that supports the probe needles, i.e., the lower surface side, of the base, and FIG. 3B is a sectional view taken along the line 3B—3B of FIG. 3A;

FIG. 5 is a plan view showing the needle side of a conventional probe card; and

FIG. 6 is a plan view showing the arrangement of IC chips to be inspected by the probe card.

DETAILED DESCRIPTION OF THE INVENTION

A probe card according to an embodiment of the present invention will be described with reference to FIGS. 1A and 1B to FIG. 4.

Figure 1A:
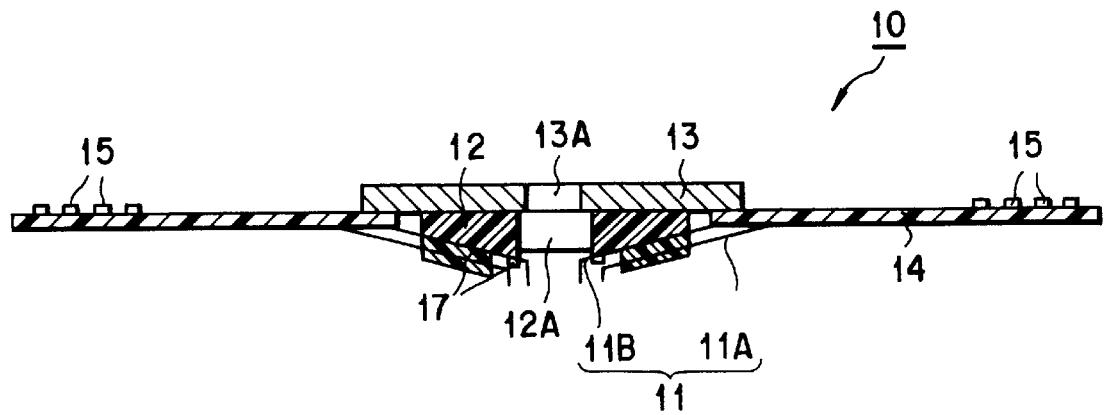
FIGS. 1A and 1B are sectional views taken in orthogonal directions to show a probe card according to an embodiment of the present invention.
Figure 1B:
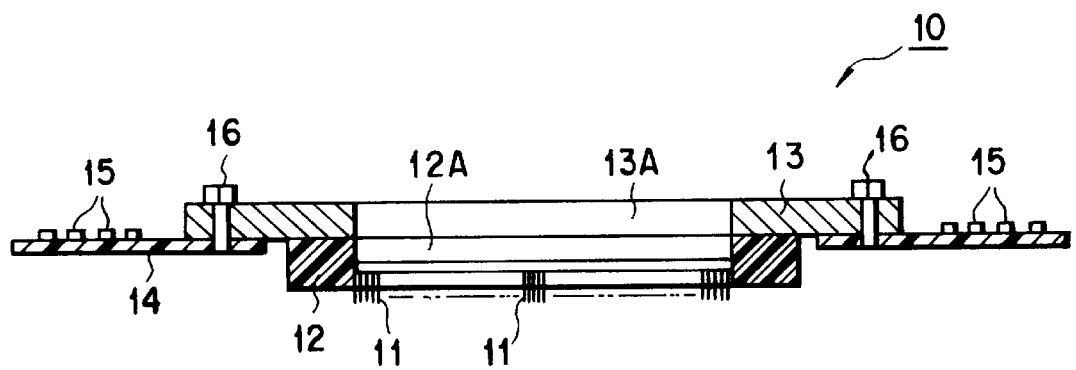

As shown in, e.g., FIGS. 1A and 1B, a probe card 10 according to this embodiment has lower- and upper-level first and second probe needle groups 11A and 11B, a base 12 for cantilevering the first and second probe needle groups 11A and 11B by supporting their proximal portions, and a printed circuit board 14 for supporting the base 12 through a rectangular support plate 13. The needle point group of the lower-level first probe needle group 11A is brought into contact with outer two columns of IC chips T1 simultaneously, and the needle point group of the upper-level second probe needle group 11B is brought into contact with inner two columns of IC chips T2 simultaneously, so that inspection of the electrical characteristics of the 4 rows×4 columns of IC chips T (see FIG. 6) on a semiconductor wafer is performed simultaneously. The support plate 13 and the printed circuit board 14 are integrally formed as they are fastened by fastening members 16, e.g., bolts.

Probe needles 11 are electrically connected to the inner ends of the respective printed wires (not shown) of the printed circuit board 14, and contact terminals 15 that are to come in electrical contact with spring contact probes (POGO pins: Trade Name) of a test head (to be described later) are formed on the outer ends of the respective printed wires. The probe needles 11 are electrically connected to a tester (not shown) through the printed circuit board 14 and the test head. The support plate 13 is made of a rectangular metal plate, and a rectangular opening portion 13A extending in the longitudinal direction is formed at the center of the support plate 13, as shown in FIGS. 1A and 1B. During inspection, the opening portion 13A dissipates heat from the probe card 10 and the semiconductor wafer to the outside.

Figure 2:
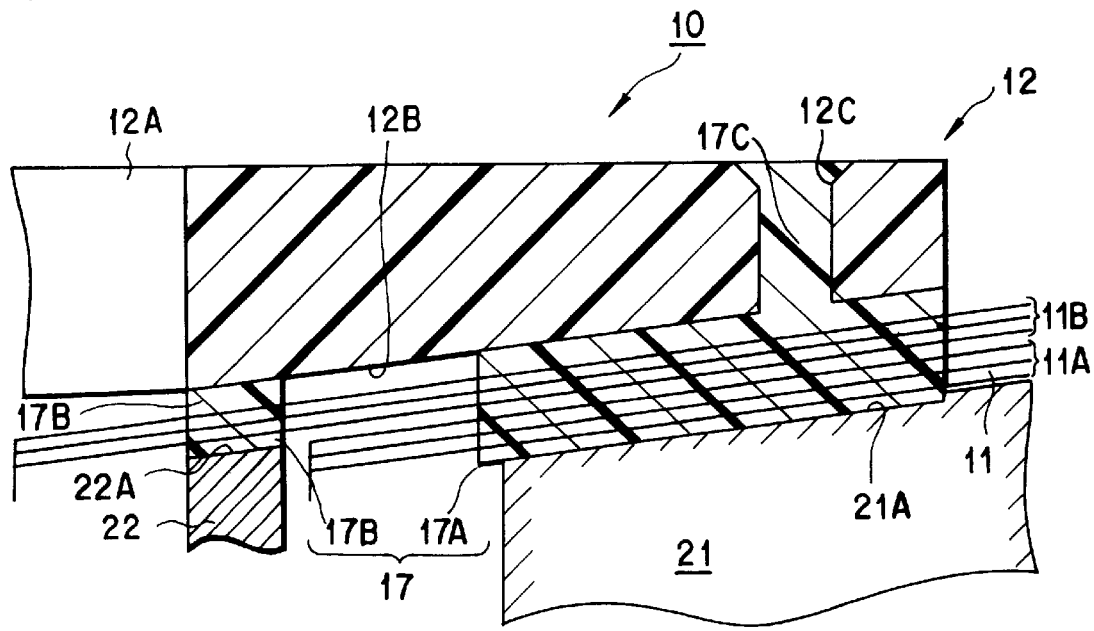
FIG. 2 is a sectional view of part of the probe card to show in enlargement the relationship between the probe needles of the probe card and a base shown in FIG. 1.

The characteristic feature of the probe card 10 of this embodiment resides in the base 12 and the mounting structure of the probe needles 11 onto the base 12, as shown in FIG. 2. The base 12 is made of a heat-resistant material, e.g., a ceramic, having insulating properties and a thermal expansion coefficient as small as possible, into a rectangular plate. As shown in FIGS. 3A and 3B, an elongated opening portion 12A extending in the longitudinal direction of the base 12 is formed at the center of the base 12. As shown in FIG. 3B, moderately sloped taper surfaces 12B are formed on the lower surface of the base 12 on the two sides of the opening portion 12A to be inclined upward from the opening portion 12A toward the two ends of the base 12. The proximal portions of the first and second probe needle groups 11A and 11B are fixed to the two taper surfaces 12B, respectively, through a synthetic resin 17, e.g., an epoxy resin, having good insulating properties and adhesion properties. This synthetic resin 17 forms the resin fixing portions of the probe needles 11. Hence, in the following description, the resin fixing portions will be referred to as resin fixing portions 17.

As shown in FIG. 2, the resin fixing portion 17 is divided into two first resin fixing portions 17A on the outer sides of the base 12 (only the right side is shown in FIG. 2) and two second resin fixing portions 17B on the opening portion 12A sides. The first resin fixing portion 17A extends in the longitudinal direction of the base and fixes the first and second probe needle groups 11A and 11B at their proximal portions (intermediate portions). As a result, the distal end portions of the first probe needle group 11A project from the first resin fixing portion 17A so that the first probe needle group 11A is cantilevered. The second resin fixing portion 17B extends in parallel with the first elongated portion 17A and fixes the second probe needle group 11B projecting from the first resin fixing portion 17A at its intermediate portions. As a result, the distal end portions of the second probe needle group 11B project from the second resin fixing portion 17B so that the second probe needle group 11B is cantilevered. The first resin fixing portion 17A and the second resin fixing portion 17B are remote from each other in the longitudinal direction of the probe needles. As a result, a rectangular gap or channel is formed between the inner side surface of the first resin fixing portion 17A and the outer side surface of the second resin fixing portion 17B, and the distal end portions of the first probe needle group 11A extend into this gap. The distal end portion of each probe has a needle point which is bent downward substantially vertically. The distal end portions of the first probe needles, i.e., the extending portions of the first probe needles extending from the first resin fixing portion 17A, are preferably long in terms of elasticity. However, due to the limitation in size, the needle points of the first probe needles are located near the second resin fixing portion 17B. The second probe needle group 11B is partly exposed to this channel above the distal end portions of the first probe needle group 11A. Thus, the space in the direction of height between the second probe needle group 11B and the first probe needle group 11A is set at such a value that the distal end portions of the first probe needle group 11A do not come in contact with the second probe needle group 11B even if they are elastically pushed upward in inspection by the needle pressure generated upon upward movement of the IC chips.

A plurality of through holes 12C are formed near the outer side surface of the base 12, as shown in FIG. 2 and FIGS. 3A and 3B, to vertically extend through the base 12. Two through holes 12C are formed on each side of the base 12 in the longitudinal direction, as shown in, e.g., FIG. 3A. These through holes 12C are filled with the same resin as that which forms the resin fixing portion 17, or with a different synthetic resin having good adhesion properties to form resin-filled portions 17C. The resin-filled portions 17C are integrated with the first resin fixing portion 17A, so the first resin fixing portion 17A does not separate from the base 12. Accordingly, the through holes 12C and the resin-filled portions 17C form a removal preventing means for all the probe needle groups. In this preferable embodiment, the diameter of the upper portion of each through hole 12C is large, as shown in FIG. 2, to further enhance the removal preventive effect.

Referring to FIGS. 3A and 3B, reference numeral 12D denotes screw holes formed in the four corners of the base 12. The base 12 and the support plate 13 are integrated with each other through screw members inserted in these screw holes 12D.

Each of the first and second probe needle groups 11A and 11B comprises three-level small groups of vertical probe needles, and the respective small groups of vertical probe needles are arranged at predetermined gaps from each other. The higher the level of the small group of probe needles, the longer its needle points (portions substantially perpendicular to the semiconductor wafer), so that the distal ends of the needle points of all the height levels are located on the same plane, i.e., are aligned. If each of the probe needle groups 11A and 11B is formed to have a plurality of levels in this manner, even if the pitch of electrode pads P of the IC chips T1 and T2 is decreased, the space between adjacent needles in each level can have a margin, so that insulation among the needles can be ensured.

How to mount the probe needles 11 onto the base 12 will be described briefly.

To mount the probe needles 11, first and second fixing jigs 21 and 22 are used, as shown in, e.g., FIG. 2. Taper surfaces 21A and 22A similar to (parallel to) the taper surfaces 12B of the base 12 are formed on the upper surfaces of the first and second fixing jigs 21 and 22. The taper surfaces 21A and 22A are coated with a release agent. Thus, when the taper surfaces 21A and 22A are coated with the synthetic resin 17, as will be described later, the synthetic resin 17 can be easily separated from the taper surfaces 21A and 22A.

To mount the probe needles 11, first, the taper surface 21A of the first fixing jig 21 and the respective small groups of probe needles of the first probe needle group 11A are built up. For this purpose, electrically insulating spacers (not shown) are interposed between the taper surface 21A and the lower-level small group of probe needles, between the lower- and intermediate-level small groups of probe needles, and between the intermediate- and upper-level small groups of probe needles, respectively, to maintain predetermined vertical gaps among the taper surface 21A and the lower-, intermediate-, and upper-level small groups of probe needles. The needle points of the first probe needle group 11A are also maintained at predetermined spaces. Thereafter, the synthetic resin 17, e.g., an epoxy resin, coats the probe group from above by spraying, brushing, extrusion, or the like, and is set, thereby integrating the first probe needle group 11A on the taper surface 21A with the synthetic resin 17 and fixing the respective needles at predetermined gaps from each other. The amount of resin and the method of resin coating are selected such that the upper surface of the set resin layer (first layer) becomes parallel to the taper surface 21A and that the set resin layer does not become too thick.

The second fixing jig 22 is arranged away from the first fixing jig 21 to maintain a small gap from the needle point group of the first probe needle group 11A. The heights of the fixing jigs 21 and 22 are set such that the taper surface 22A of the second fixing jig 22 substantially coincides with the extension of the taper surface formed by the highest-level small group of probe needles of the first probe needle group 11A. After this arrangement, the second probe needle group 11B is built on the taper surface of the resin layer, on which the first probe needle group 11A is fixed, in the same manner as in fixing the first probe needle group 11A. The second probe needle group 11B is integrated on the first probe needle group 11A with the synthetic resin 17, and the first resin fixing portion 17A (consisting of the first resin layer and the second resin layer formed on it) is formed on the first fixing jig 21. A synthetic resin is applied also on the second probe needle group 11B on the taper surface 22A, thereby forming the second resin fixing portion 17B on the taper surface 22A. By this operation, the first probe needle group 11A and the second probe needle group 11B are integrated on the first fixing jig 21 with the synthetic resin 17A. Therefore, the second probe needle group 11B is integrated on the second fixing jig 22 with the synthetic resin 17B.

Thereafter, the synthetic resin 17 is applied to the taper surface formed with the highest-level small group of probe needles of the second probe needle group 11B above the first and second fixing jigs 21 and 22 to have a uniform thickness in such a manner that its upper surface forms a taper surface parallel to the taper surfaces 21A and 22A. Before this synthetic resin 17 is set, the base 12 is placed on this taper surface, the probe needles 11 are adhered to the taper surfaces 12B of the base 12, and the synthetic resin 17 is filled in the through holes 12C of the base 12. When the synthetic resin 17 is then set, the first resin fixing portion 17A is integrated with the resin-filled portions 17C, and the first and second probe needle groups 11A and 12B are completely fixed on the base 12 through the synthetic resin 17. Alternatively, a resin may be filled in the through holes 12C after the synthetic resin between the base 12 and the jigs 21 and 22 is set.

Figure 4:
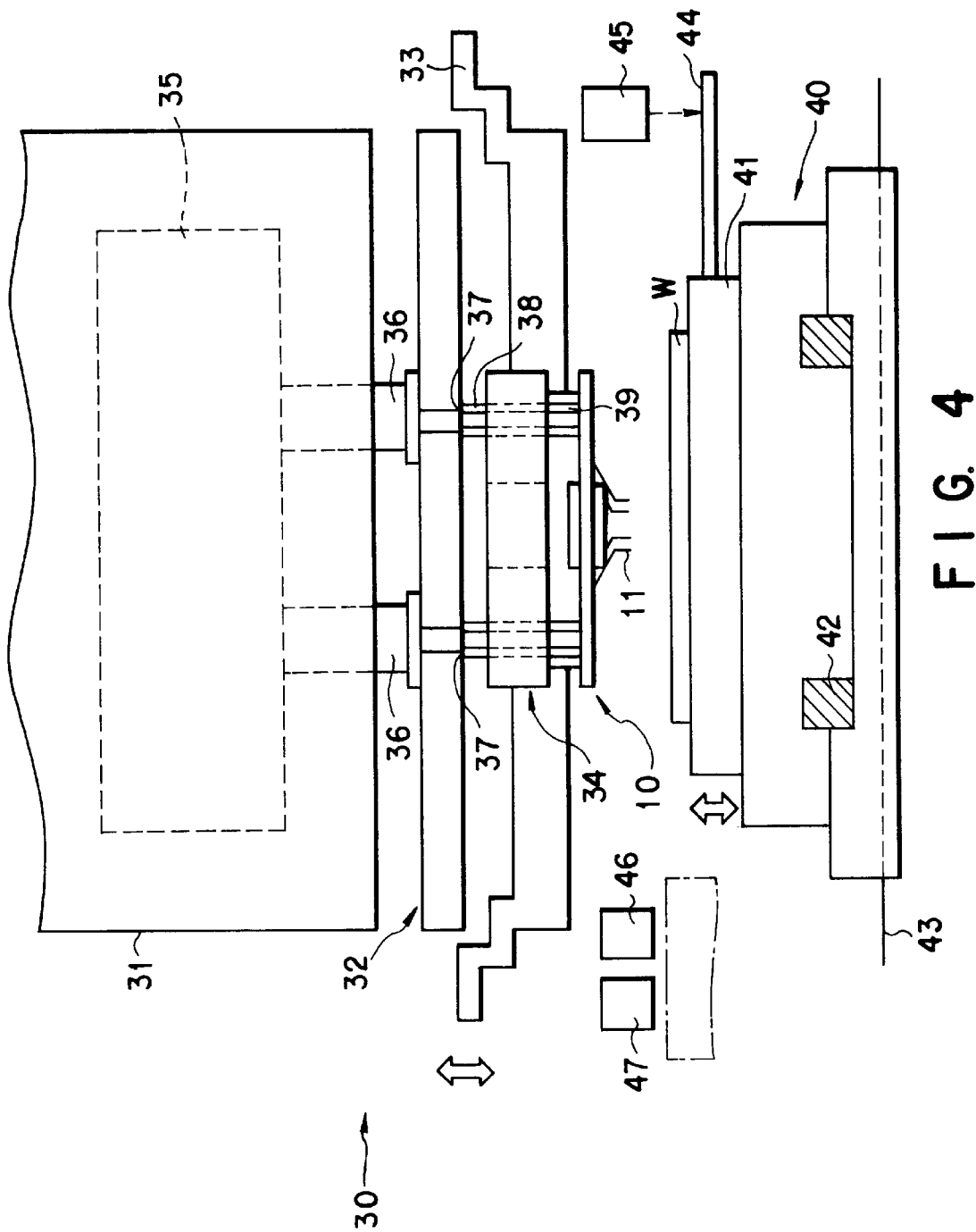
FIG. 4 is a side view showing the main part of a probe unit to which the probe card shown in FIG. 1 is applied.

The probe card 10 thus manufactured and having an arrangement described above is used by being mounted on a probe unit 30, as shown in, e.g., FIG. 4. This probe unit 30 has a test head 31, a performance board 32, a connection ring 34, and the probe card 10 of this embodiment. The test head 31 can be vertically moved by an elevating mechanism (not shown). The performance board 32, the connection ring 34, and the probe card 10 are sequentially disposed in an apparatus main body (not shown) below the test head 31. The connection ring 34 is supported by an insert ring 33 to be connected to the performance board 32. The probe card 10 of this embodiment is disposed below the connection ring 34.

A pin electronic unit 35 comprising a sample power supply for applying a voltage to IC chips on a semiconductor wafer W, an input unit for inputting an output from the IC chips to a measurement unit, and the like is incorporated in the test head 31. The pin electronics 35 is electrically connected to a plurality of electronic component circuits 36 mounted on the performance board 32. For example, the connection terminals 37 of the respective electronic component circuits 36 are arranged circularly. POGO pins 38 corresponding to the connection terminals 37 are arranged on the upper surface of the connection ring 34, and POGO pins 39 electrically connected to the POGO pins 38 are formed on the lower surface of the connection ring 34 to correspond to the connection terminals of the probe card 10. Hence, the probe card 10 can be electrically connected to the test head 31 through the performance board 32 and the connection ring 34.

As shown in FIG. 4, a stage 40 is formed below the probe card 10, and the semiconductor wafer W is horizontally held with a wafer chuck 41 disposed on the upper surface of the stage 40. The stage 40 has a drive mechanism (not shown) for driving the wafer chuck 41 in the horizontal, vertical, and θ directions. In alignment of the semiconductor wafer W, the drive mechanism drives the stage 40 to move in the X and Y directions on rails 42 and 43 and the wafer chuck 41 to rotate in the θ direction and move in the vertical direction. A target plate 44 is attached to the wafer chuck 41. The target plate 44 and a predetermined IC chip T are detected by optical image pickup units 45 and 46 and an capacitive sensor 47 that are disposed above the target plate 44. Based on this detection signal, the positions of the probe card 10 and of the IC chip on the semiconductor wafer W are calculated. Based on this calculation result, the drive mechanism of the stage 40 is controlled to align an inspection target IC chip on the semiconductor wafer W with the probe card 10.

The operation will be described. To electrically inspect the semiconductor wafer W, the wafer chuck 41 with the semiconductor wafer W supported on it moves in the X, Y, Z, and θ directions through the target plate 44, the optical image pickup units 45 and 46, and the capacitive sensor 47, to align the semiconductor wafer W with the probe card 10. After alignment, when the wafer chuck 41 is moved upward, the respective electrodes P of the IC chips T on the semiconductor wafer W come in contact with the needle points of the first and second probe needle groups 11A and 11B. Furthermore, the wafer chuck 41 overdrives to bring the first and second probe needle groups 11A and 11B into contact with the electrode pads P, so that the first and second probe needle groups 11A and 11B are electrically connected to the electrode pads P.

In this state, a predetermined electrical signal is sent from the test head 31 to the IC chips T through the performance board 32, the connection ring 34, the first and second probe needle groups 11A and 11B, and the electrode pads P. Then, an output signal based on this input signal is input from the IC chips T to the pin electronic unit 35 through the connection ring 34 and the electronic component circuits 36 of the performance board 32, thereby electrically inspecting the IC chips T. At this time, the needle point groups of the first and second probe needle groups 11A and 11B can be set upright on the electrode pads P of the 2 rows×4 columns on each side, i.e., 4 rows×4 columns on the two sides, of the IC chips T simultaneously, thereby performing inspection. In addition, not only the needle point group of the first probe needle group 11A but also the needle point group of the second probe needle group 11B is also directly supported by the taper surfaces 12B of the base 12. Therefore, the probe needles 11 constituting the respective probe needle groups 11A and 11B reliably obtain a predetermined needle pressure at any position, so that stable inspection free from variations in needle pressure can be performed.

As described above, according to this embodiment, the opening portion 12A, to which the distal end portions of the first probe needle group 11A do not expose but only the needle point group of the second probe needle group 11B extends to expose, is formed in the base 12 of the probe card 10. The first and second probe needle groups 11A and 11B are fixed on the taper surfaces 12B of the base 12 with the first and second resin fixing portions 17A and 17B using the synthetic resin 17. Therefore, during inspection, the needle point groups of both the first and second probe needle groups 11A and 11B come in contact with the electrode pads P of the IC chips T while maintaining a predetermined needle pressure, thus performing stable inspection. In particular, in the case of the conventional probe card shown in FIG. 5, since the fixing plates 4 tend to flex easily, depending on the location, the needle points of the probe needle group 1B supported by the fixing plates 4 sometimes cannot obtain a predetermined needle pressure, and stable inspection cannot thus be performed. In this embodiment, since the second probe needle group 11B is directly supported by the base 12, a predetermined needle pressure can be reliably maintained at any location, and stable inspection can therefore be performed.

According to this embodiment, the first and second probe needle groups 11A and 11B are fixed on the taper surfaces 12B of the base 12 with the first and second resin fixing portions 17A and 17B using the synthetic resin 17. Therefore, even when mounting particularly the second probe needle group 11B to the base 12, the base 12 does not deform, and the respective probe needles 11 can be mounted on the base 12 at high precision as designed without requiring a skill for this operation. Since the first resin fixing portion 17A for fixing the first and second probe needle groups 11A and 11B is integrated with the resin-filled portions 17C, the first and second probe needle groups 11A and 11B can be firmly integrated with the base 12 such that they will not remove from the base 12. Furthermore, since each of the first and second probe needle groups 11A and 11B consists of three vertical levels of small groups of probe needles, even if the pitch among the electrode pads P is decreased, the pitch of the probe needles 11 can be decreased accordingly. Since the needle points of the first probe needle group 11A are arranged before the second resin fixing portion 17B, when mounting the second probe needle group 11B by using the first and second fixing jigs 21 and 22, the second fixing jig 22 can be coated with the synthetic resin 17 without being interfered with by the first probe needle group 11A, so that the second probe needle group 11B can be mounted on the base 12 very easily.

In the above embodiment, a probe card having two columns of probe needles on each side has been described. However, the present invention can also be applied to a probe card that cantilevers three or more columns of probe needles. The design of the constituent elements of the present invention can be modified as required.

As has been described, with the invention according to claim 1, there is provided a probe card in which a predetermined needle pressure can be reliably maintained with all the probe needles so that stable inspection can be performed, and a skill is not required when mounting the probe needles to the base.

With the invention according to claim 2, there is provided a probe card in which the respective vertical levels of probe needle groups can be firmly integrated with the base so that they will not remove from the base.

With the invention according to claim 3, there is provided a probe card according to claim 1, in which the needle points of the lower-level probe needle groups are arranged before the resin fixing portion of a probe needle group which is above the lower-level probe needle group by one level, so that the probe needles can be mounted on the base very easily.

With the invention according to claim 4, there is provided a probe card in which each of the respective vertical levels of probe needle groups is constituted by a plurality of vertical levels of small groups of probe needles, so that a decrease in pitch of the electrodes of an inspection target can be coped with.

The probe card according to any one of the claims can be formed easily by positioning the probe needles highly precisely.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A probe card comprising:

an upper-level probe needle group having distal end portions and intermediate portions;

a lower-level probe needle group located below said upper-level probe needle group and having distal end portions and intermediate portions;

a base having a frame portion to define an opening portion therein and having a lower surface; and first and second resin fixing portions mounted on said lower surface of said frame portion of said base and remote from each other to define a channel therebetween, the channel having a bottom wall formed by a portion of the base connecting the first and second resin fixing portions, said first resin fixing portion supporting said upper- and lower-level probe needle groups such that said intermediate portions of said upper- and lower-level probe groups are electrically insulated from each other, that said distal end portions of said upper-level probe group are exposed to said opening portion of said base, and that said distal end portions of said lower-level probe needle group are exposed to said channel, and said second resin fixing portion supporting said intermediate portions of said upper-level probe needle group to be electrically insulated from each other, wherein needle point groups of said respective probe needle groups are brought into contact with electrodes of a plurality of rows×a plurality of columns of semiconductor elements on an inspection target body simultaneously, thereby performing inspection of electrical characteristics of said plurality of semiconductor elements simultaneously.

2. A probe card according to claim 1 wherein said first and second resin fixing portions support the probe needles of at least one of the upper-level probe needle group and the lower-level probe needle group such that a gap is formed between the probe needles and the lower surface of the frame portion.

3. A probe card according to claim 1, wherein said lower-level probe needle group has needle points located near said second resin fixing portion.

4. A probe card according to claim 1, wherein each of said upper- and lower-level probe needle groups has a plurality of vertical levels of small groups of probe needles.

5. A probe card according to claim 1, wherein said first resin fixing portion has a first layer for supporting said intermediate portions of said lower-level probe needle group and having an upper surface, and a second layer integrally formed on said first layer to support said intermediate portions of said upper-level probe needle group, and said second resin fixing portion has a thickness substantially equal to that of said second layer.

6. A probe card according to claim 5, wherein said second layer and said second resin fixing portion are formed in the same process after formation of said first resin layer.

7. A probe card according to claim 1, wherein said lower surface of said frame portion has a taper surface, said probe needles extend to be parallel to said taper surface, and said first and second resin fixing portions have lower surfaces parallel to said taper surface.

8. A probe card according to claim 1, wherein said frame portion has an upper surface and at least one through hole extending from said upper surface to said lower surface, and a resin-filled portion filled in the through hole and integrated with said first resin fixing portion.

9. A probe card according to claim 8 wherein said through hole includes an upper portion having a cross section larger than that of an adjacent portion continuing the upper portion, the upper and adjacent portions of the through hole being filled with resin.

10. A probe card according to claim 8 wherein said through hole is a cylindrical hole having an upper portion and lower portion, the diameter of the upper portion being larger than that of the lower portion, the upper and lower portions of the through hole being filled with resin.

11. A probe card comprising:

a first probe needle group having distal end portions and intermediate portions;

a first resin layer with which said intermediate portions of said first probe needle group are partly electrically insulated from each other to be cantilevered;

a second probe needle group having intermediate portions and distal end portions that are arranged on said first resin layer to be electrically insulated from each other;

a second resin layer formed on said first resin layer to fix part of said intermediate portions of said second probe needle group, thereby fixing said intermediate portions of said second probe needle group on said first resin layer;

a resin fixing portion located remote from said second resin layer in a longitudinal direction of said probe needles and fixing another part of said second probe needle group which is remote from said part of said intermediate portions thereof, thereby cantilevering said second probe needles; and a base having a lower surface on which said second resin layer and said resin fixing portion are mounted to be remote from each other, said distal end portions of said first probe needle group being exposed to a portion between said second resin layer and said resin fixing portion, and said distal end portions of said second probe group extending from said resin fixing portion in a direction opposite to said second resin layer being exposed, the portion of the base positioned between the second resin layer and the resin fixing portion being solid.

12. A probe card comprising:

two groups of upper-level probe needles, each probe needle having a distal end portion and an intermediate portion;

two groups of lower-level probe needles located below said upper-level probe needles, each probe needle having a distal end portion and an intermediate portion;

a base having two lateral portions defining an opening portion therebetween, each lateral portion having an upper surface and a lower surface; and first and second resin fixing portions mounted on the lower surface of each of said lateral portions and remote from each other to define a channel therebetween, the channel having a bottom wall formed by a part of the lateral portion between the first and second resin fixing portions, said first resin fixing portion supporting each of the groups of said upper- and lower-level probe needles such that said intermediate portions of each of the groups of said upper-level probe needles and each of the groups of lower-level probe needles are electrically insulated from each other, that said distal end portions of each of the groups of said upper-level probe needles are exposed to said opening portion of said base, and that said distal-end portions of each of the groups of said lower-level probe needles are exposed to said channel, and said second resin fixing portion supporting said intermediate portions of each of the groups of said upper-level probe needles to be electrically insulated from each other.

13. A probe card according to claim 12 wherein each of said lateral portions includes at least one through hole extending from the upper surface to the lower surface, and resin-filled portion filled in the through hole and integrated with said first resin fixing portion.

* * * * *